US012571483B2

(12) United States Patent
Min et al.

(10) Patent No.: US 12,571,483 B2
(45) Date of Patent: Mar. 10, 2026

(54) BLOCK VALVE FOR SUBSTRATE PROCESSING DEVICE, AND SUBSTRATE PROCESSING DEVICE

(71) Applicant: JUSUNG ENGINEERING CO., LTD., Gwangju-si (KR)

(72) Inventors: Myeong Ki Min, Gwangju-si (KR); Tae Ho Lee, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 666 days.

(21) Appl. No.: 18/009,326

(22) PCT Filed: May 25, 2021

(86) PCT No.: PCT/KR2021/006470
§ 371 (c)(1),
(2) Date: Dec. 8, 2022

(87) PCT Pub. No.: WO2022/025402
PCT Pub. Date: Feb. 3, 2022

(65) Prior Publication Data
US 2023/0228339 A1 Jul. 20, 2023

(30) Foreign Application Priority Data
Jul. 27, 2020 (KR) ........................ 10-2020-0093028

(51) Int. Cl.
*C23C 16/40* (2006.01)
*C23C 16/455* (2006.01)
(Continued)

(52) U.S. Cl.
CPC ............ *F16K 27/02* (2013.01); *C23C 16/455* (2013.01); *F16K 41/10* (2013.01)

(58) Field of Classification Search
CPC ........ F16K 27/02; F16K 41/10; F16K 27/003; F16K 1/38; F16K 27/0254; F16K 31/12;
(Continued)

(56) References Cited

U.S. PATENT DOCUMENTS 6,305,665 B1 10/2001 Coura et al.
7,610,928 B2 * 11/2009 Feldman ............. F16K 27/0263
251/321
(Continued)

FOREIGN PATENT DOCUMENTS

CN 108780736 A 11/2018
CN 108885978 A 11/2018
(Continued)

OTHER PUBLICATIONS

International Search Report for PCT/KR2021/006470 mailed Aug. 24, 2021.

*Primary Examiner* — Rudy Zervigon
(74) *Attorney, Agent, or Firm* — Renaissance IP Law Group LLP

(57) ABSTRACT

The present inventive concept relates to a block valve for a substrate processing device, and a substrate processing device, the block valve comprising: a valve part having a contracting and expanding opening and closing part; a drive part which drives the opening and closing part; and a block body which comprises an accommodating part in which the opening and closing part is accommodated, wherein the block body comprises a gas inflow port connected to the accommodating part and a gas outflow port connected to the accommodating part, and the opening and closing part opens and closes the gas inflow port or the gas outflow port, within the accommodating part.

8 Claims, 7 Drawing Sheets

(51) Int. Cl.
   _F16K 27/02_ (2006.01)
   _F16K 41/10_ (2006.01)
   _F15B 13/00_ (2006.01)

(58) Field of Classification Search
   CPC . F16K 1/46; F16K 19/00; F16K 11/22; F16K
   51/02; F16K 27/0263; F16K 27/00; C23C
   16/455; C23C 16/45561; C23C 16/52;
   C23C 16/45544; C23C 16/45563; H01L
   21/67; H01L 21/67017; F15B 13/0892;
   F15B 13/0814; F15B 13/0871; F15B
   13/0896; F15B 13/0839; F15B 13/0807;
   F15B 13/0832; F15B 2013/004; F15B
   2013/006; F15B 13/0817; F15B 13/0825;
   H01J 37/32431; H01J 37/3244
   USPC ........ 118/715; 156/345.33, 345.34; 251/318,
   251/321; 137/884, 1, 606
   See application file for complete search history.

(56) References Cited

U.S. PATENT DOCUMENTS

| | | | |
|---|---|---|---|
| 2001/0010365 A1* | 8/2001 | Iwabuchi | F16K 41/10 |
| | | | 251/64 |
| 2003/0155024 A1 | 8/2003 | Hanada et al. | |
| 2006/0169935 A1 | 8/2006 | Yajima | |
| 2007/0215209 A1* | 9/2007 | Street | F17C 5/06 |
| | | | 137/263 |
| 2008/0223455 A1* | 9/2008 | Fukuhara | C23C 16/45557 |
| | | | 137/488 |
| 2008/0271796 A1* | 11/2008 | Neumann | F17C 5/06 |
| | | | 137/606 |
| 2016/0153583 A1 | 6/2016 | Nakamura | |
| 2017/0183773 A1* | 6/2017 | Okura | C23C 16/45527 |
| 2017/0204989 A1* | 7/2017 | Burkhart | F16K 27/003 |

FOREIGN PATENT DOCUMENTS

| | | | |
|---|---|---|---|
| JP | S6124584 U | 2/1986 | |
| JP | 590058 U | 12/1993 | |
| JP | H10148272 A | 6/1998 | |
| JP | 2003021248 A | 1/2003 | |
| JP | 2004019792 A | 1/2004 | |
| JP | 2008012405 A | 1/2008 | |
| JP | 2012207796 A | 10/2012 | |
| JP | 2015021609 A | 2/2015 | |
| KR | 19980042522 A | 8/1998 | |
| KR | 20060088065 A | 8/2006 | |
| KR | 20200026446 A | 3/2020 | |
| WO | 2013161640 A1 | 10/2013 | |

* cited by examiner

BLOCK VALVE FOR SUBSTRATE PROCESSING DEVICE, AND SUBSTRATE PROCESSING DEVICE

TECHNICAL FIELD

The present disclosure relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc. Such a processing process is performed on a substrate by a substrate processing apparatus.

FIG. 1 is a schematic configuration diagram of a substrate processing apparatus according to the related art.

Referring to FIG. 1, a substrate processing apparatus 100 according to the related art includes a substrate processing unit 110, a gas supply unit 120, a gas block 130, and a valve unit 140.

The substrate processing unit 110 performs a processing process on the substrate by using a gas supplied by the gas supply unit 120.

The gas supply unit 120 supplies a gas which is to be used for the processing process. The gas supply unit 120 is connected to the substrate processing unit 110 through the gas block 130 and the valve unit 140.

The gas block 130 is connected to each of the gas supply unit 120, the valve unit 140, and the substrate processing unit 110. The gas block 130 is connected to the gas supply unit 120 and the valve unit 140 through a supply flow path 131. An inlet of the supply flow path 131 is connected to the gas supply unit 120 through a pipe, and an outlet thereof is connected to the valve unit 140 through a pipe. The gas block 130 is connected to the valve unit 140 and the substrate processing unit 110 through an emission flow path 132. An inlet of the emission flow path 132 is connected to the valve unit 140 through a pipe, and an outlet thereof is connected to the substrate processing unit 110 through a pipe.

The valve unit 140 is connected to the gas block 130 through a pipe. The valve unit 140 includes an opening/closing flow path 141 connected to each of the supply flow path 131 and the emission flow path 132, a valve body 142 where the opening/closing flow path 141 is formed, and an opening/closing mechanism 143 for opening/closing the opening/closing flow path 141.

When the opening/closing mechanism 143 opens the opening/closing flow path 141, a gas supplied by the gas supply unit 120 is supplied to the substrate processing unit 110 via the supply flow path 131 of the gas block 130, the opening/closing flow path 141 of the valve unit 140, and the emission flow path 132 of the gas block 130. When the opening/closing mechanism 143 closes the opening/closing flow path 141, the gas supplied by the gas supply unit 120 is supplied to the opening/closing flow path 141 of the valve unit 140 via the supply flow path 131 of the gas block 130, and then, is blocked by the opening/closing mechanism 143 and thus is not supplied to the emission flow path 132 of the gas block 130. The opening/closing mechanism 143 opens/closes the opening/closing flow path 141 on the basis of predetermined process information, and thus, in the substrate processing unit 110, a processing process is performed on the substrate on the basis of the process information.

As described above, the opening/closing flow path 141 is provided for the selective supply of a gas, and the supply flow path 131 and the emission flow path 132 are provided for a connection with each of the gas supply unit 120 and the substrate processing unit 110. Therefore, in the substrate processing apparatus 100 according to the related art, the selective supply of a gas is substantially performed by the opening/closing flow path 141 and the opening/closing mechanism 143, and thus, an undesired dead space occurs in the supply flow path 131 and the emission flow path 132. Therefore, in the substrate processing apparatus 100 according to the related art, the flowability of a gas is reduced by the dead space, and due to this, there is a problem where an adverse effect is applied to a processing process performed on a substrate. Also, as a length of a flow path for connecting the gas supply unit 120 to the substrate processing unit 110 increases, particles may occur in the supply flow path 131 and the emission flow path 132. Also, as lengths of the supply flow path 131 and the emission flow path 132 extend more, a problem is worse where the flowability of a gas is reduced, an adverse effect is applied to a processing process performed on a substrate, and an upper space of a chamber of the substrate processing unit 110 is much occupied.

DISCLOSURE

Technical Problem

The present inventive concept is devised to solve the above-described problem and is for providing a block valve and a substrate processing apparatus, which may decrease a dead space in implementing the selective supply of a gas.

Technical Solution

To accomplish the above-described objects, the present inventive concept may include the following elements.

A block valve for substrate processing apparatuses according to the present inventive concept may include: a valve unit including an opening/closing unit which contracts and expands; a driver driving the opening/closing unit; and a block body including an accommodation unit with the opening/closing unit accommodated thereinto. The block body may include a gas inflow port connected to the accommodation unit and a gas outflow port connected to the accommodation unit. The opening/closing unit may open or close the gas inflow port or the gas outflow port, in the accommodation unit.

A block valve for substrate processing apparatuses for selectively supplying a gas, supplied by a gas supply unit, to a substrate processing unit where a processing process is performed on a substrate, according to the present inventive concept, may include: a block body connected to each of the gas supply unit and the substrate processing unit; a valve unit coupled to the block body; and a driver driving the opening/closing unit. The block body may include a gas inflow port connected to the gas supply unit, a gas outflow port connected to the substrate processing unit, and an accommodation unit connected to each of the gas inflow port and the gas outflow port between the gas inflow port and the gas outflow port. The valve unit may include an opening/closing unit, opening or closing one of the gas inflow port and the gas outflow port, and a valve body movably coupled to the opening/closing unit. The valve body may be inserted into and coupled to the block body so that the opening/closing unit moves in the accommodation unit to open or close one of the gas inflow port and the gas outflow port.

A substrate processing apparatus according to the present inventive concept include: a chamber providing a processing space; a supporting unit supporting at least one substrate; a gas injection unit injecting a gas toward the supporting unit; a gas supply unit supplying a gas to the gas injection unit; and a block valve connected to each of the gas supply unit and the gas injection unit. The block valve may include: a block body connected to each of the gas supply unit and the gas injection unit; a valve unit coupled to the block body; and a driver driving the valve unit. The block body may include a gas inflow port connected to the gas supply unit, a gas outflow port connected to the gas injection unit, and an accommodation unit connected to each of the gas inflow port and the gas outflow port, between the gas inflow port and the gas outflow port. The valve unit may include an opening/closing unit opening or closing one of the gas inflow port and the gas outflow port, and a valve body movably coupled to the opening/closing unit. The valve body may be inserted into and coupled to the block body so that the opening/closing unit moves in the accommodation unit to open or close one of the gas inflow port and the gas outflow port.

Advantageous Effect

According to the present inventive concept, the following effects may be obtained.

The present inventive concept is implemented to have all of a connection function, performed on each of a gas supply unit and a substrate processing unit by using a block body, and a selective supply function of selectively supplying a gas. Therefore, the present inventive concept may decrease a dead space (i.e., a chamber upper space) of a gas flow path for enabling a gas to flow in the block body. Accordingly, the present inventive concept may enhance the flowability of a gas, thereby enhancing the quality of a substrate on which a processing process is completed.

In the present inventive concept, because a separate flow path for enabling a gas to flow in a valve unit is not provided, a total size of the valve unit may be reduced. Also, in the present inventive concept, the valve unit may be inserted into the block body, and thus, a total size of a block valve may be more reduced. Accordingly, in the present inventive concept, the block valve may be implemented to be compact, and thus, an area occupying an installation space may be reduced.

MODE FOR INVENTION

Hereinafter, an embodiment of a substrate processing apparatus according to the present inventive concept will be described in detail with reference to the accompanying drawings. A block valve according to the present inventive concept may include a substrate processing apparatus according to the present inventive concept, and thus, will be described together in describing an embodiment of a substrate processing apparatus according to the present inventive concept.

Figure 2:
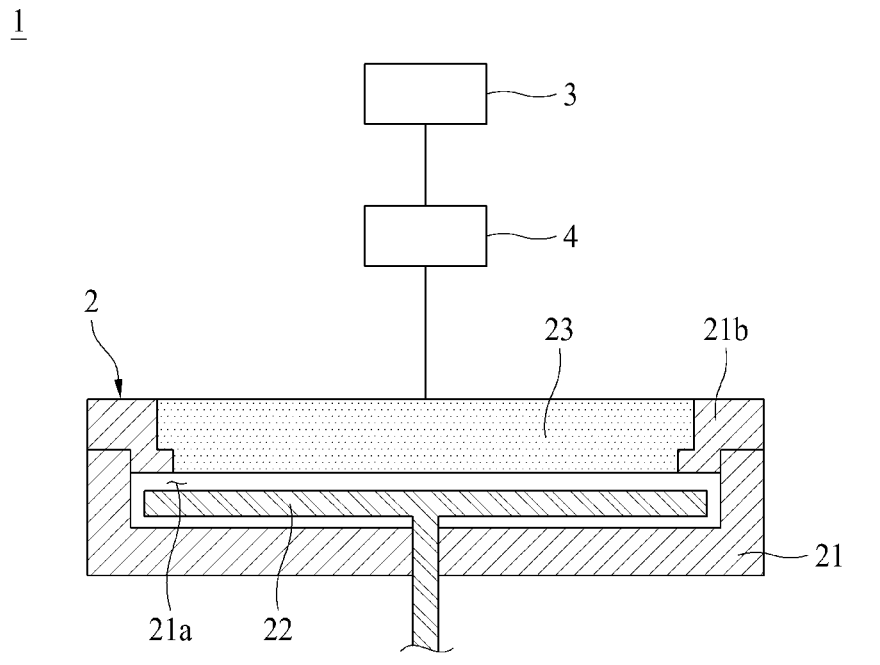
FIG. 2 is a schematic configuration diagram of a substrate processing apparatus according to the present inventive concept.
Figure 3:
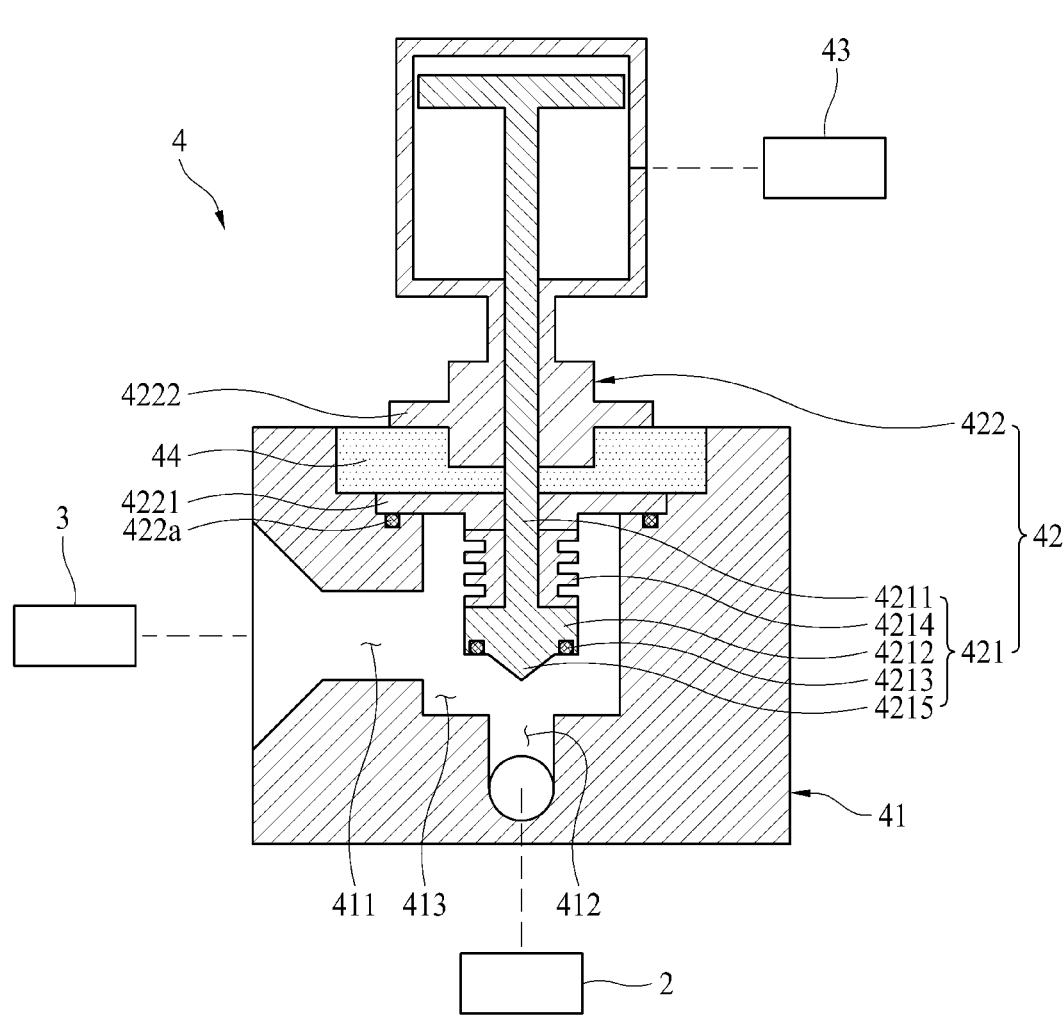
FIGS. 3 and 4 are schematic side cross-sectional views of a substrate processing apparatus according to the present inventive concept.

Referring to FIGS. 2 and 3, a substrate processing apparatus 1 according to the present inventive concept performs a processing process on a substrate S. The substrate S may be a glass substrate, a silicon substrate, a metal substrate, or the like. The substrate processing apparatus 1 according to the present inventive concept may perform a deposition process of depositing a thin film on the substrate S and an etching process of removing a portion of the thin film deposited on the substrate S. Hereinafter, an embodiment where the substrate processing apparatus 1 according to the present inventive concept performs the deposition process will be described, but it is obvious to those skilled in the art to implement an embodiment where the substrate processing apparatus 1 according to the present inventive concept performs another processing process such as the etching process.

The substrate processing apparatus 1 according to the present inventive concept may include a substrate processing unit 2, a gas supply unit 3, and a block valve 4.

<Substrate Processing Unit>

Referring to FIG. 2, the substrate processing unit 2 performs a processing process on a substrate. The substrate process unit 2 may perform the processing process by using a gas supplied from the gas supply unit 3. The substrate process unit 2 may include a chamber 21, a supporting unit 22, and a gas injection unit 23.

The chamber 21 provides a processing space 21a. A processing process, such as a deposition process and an etching process performed on the substrate, may be performed in the processing space 21a. The processing space 21a may be disposed in the chamber 21. An exhaust port (not shown), which exhausts a gas from the processing space 21a, may be coupled to the chamber 21. The supporting unit 22 and the gas injection unit 23 may be installed in the chamber 21.

The supporting unit 22 supports the substrate. The supporting unit 22 may support one substrate, or may support a plurality of substrates. In a case where a plurality of substrates are supported by the supporting unit 22, a processing process may be performed on the plurality of substrates at a time. The supporting unit 22 may be coupled to the chamber 21. The supporting unit 22 may be disposed in the chamber 21.

The gas injection unit 23 injects a gas toward the supporting unit 22. The gas injection unit 23 may be coupled to the chamber 21. The gas injection unit 23 may be disposed to be opposite to the supporting unit 22. The processing space 21a may be disposed between the gas injection unit 23 and the supporting unit 22. The gas injection unit 23 may be coupled to a lid 21b. The lid 21b is coupled to the chamber 21 to cover an upper portion of the chamber 21.

<Gas Supply Unit>

Referring to FIG. 2, the gas supply unit 3 supplies a gas. The gas supplied by the gas supply unit 3 may be injected into the processing space 21a through the gas injection unit 23, and thus, may be used for a processing process performed on the substrate. The gas supply unit 3 may supply a source gas including a thin film material which is to be deposited on the substrate, a reactant gas which reacts with the source gas, and a purge gas for purging a gas which is in the processing space 21a. The gas supply unit 3 may include at least one storage tank (not shown) which stores a gas. The gas supply unit 3 may be connected to the substrate processing unit 2 through the block valve 4. Accordingly, the gas supplied by the gas supply unit 3 may be supplied to the substrate processing unit 2 via the block valve 4.

<Valve Unit>

Referring to FIGS. 2 to 5, the block valve 4 selectively supplies a gas, supplied by the gas supply unit 3, to the substrate processing unit 2. The block valve 4 may be implemented as a block valve 4 for substrate processing apparatuses according to the present inventive concept. The block valve 4 may be connected to each of the gas supply unit 3 and the substrate processing unit 2. In this case, the block valve 4 may be connected to the gas injection unit 23 of the substrate processing unit 2. When the block valve 4 allows a gas to pass through the block valve 4, the gas supplied by the gas supply unit 3 may pass through the block valve 4 and may be supplied to the substrate processing unit 2, and then, may be injected into the processing space 21a through the gas injection unit 23. When the block valve 4 blocks the flow of a gas, the gas supplied by the gas supply unit 3 may not pass through the block valve 4, and thus, may not be supplied to the substrate processing unit 2. The block valve 4 may selectively transfer the gas supplied by the gas supply unit 3 on the basis of predetermined process information. The process information may include a gas injection timing, a gas injection time, and a gas flow rate based on the process information and may be previously set by a worker. The process information may be stored in a control unit (not shown). In this case, the block valve 4 may selectively transfer the gas supplied by the gas supply unit 3 on the basis of control by the control unit.

The block valve 4 may include a block body 41, a valve unit 42, and a driver 43.

The block body 41 is connected to each of the gas supply unit 3 and the substrate processing unit 2. The valve unit 42 may be coupled to the block body 41. Therefore, the block body 41 is implemented to function as a gas flow path for enabling a gas to be supplied from the gas supply unit 3 to the substrate processing unit 2 and to enable a corresponding gas flow path to be selectively opened or closed by the valve unit 42. That is, the block body 41 is provided to implement all of a connection performed on each of the gas supply unit 3 and the substrate processing unit 2 and the selective supply of a gas. Accordingly, the substrate processing apparatus 1 according to the present inventive concept may realize the following effects.

Figure 1:
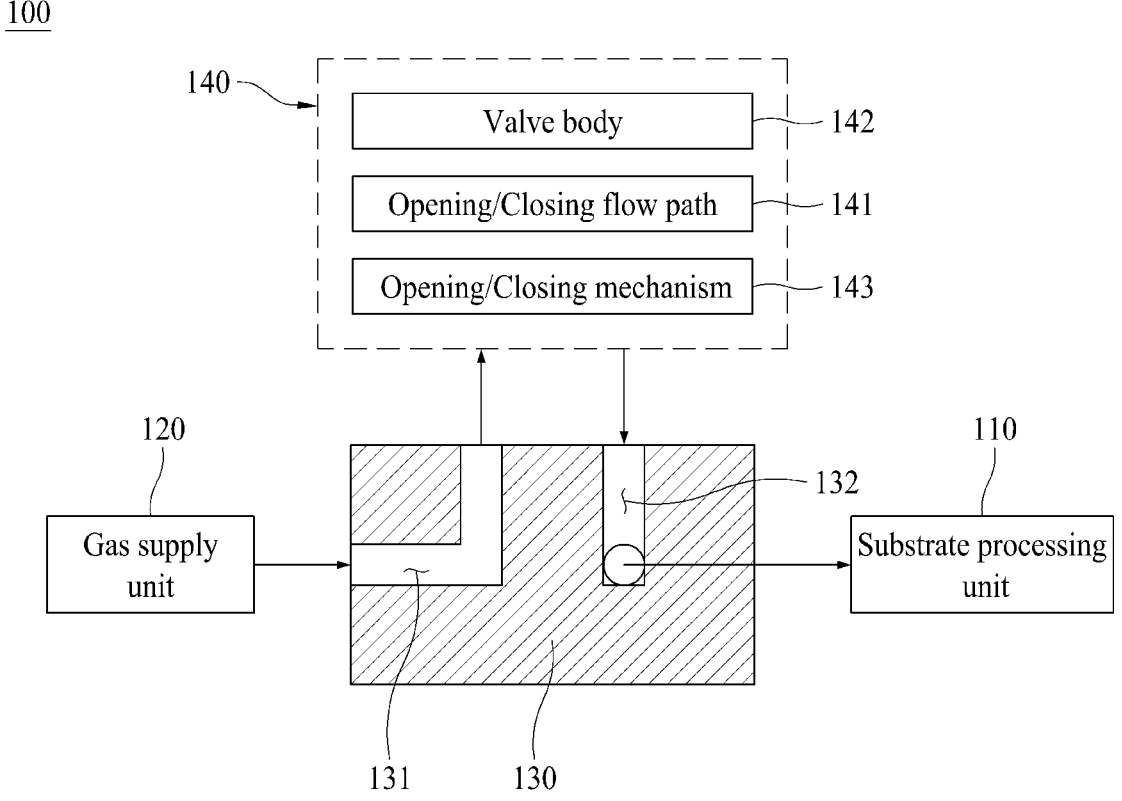
FIG. 1 is a schematic configuration diagram of a substrate processing apparatus according to the related art.

First, as illustrated in FIG. 1, in a comparative example where the valve body 142 including the opening/closing flow path 141 for the selective supply of a gas, the supply flow path 131 for connecting the gas supply unit 120 to the substrate processing unit 110, and the gas block 130 including the emission flow path 132 are separately provided, a flow path which performs a repetitive function is in two blocks, and due to this, an undesired dead space occurs. In the comparative example, the flowability of a gas is reduced by the dead space, and due to this, a processing process performed on a substrate is adversely affected. Also, as a length of a flow path for connecting the gas supply unit 120 to the substrate processing unit 110 increases, a dead space is more enlarged in the supply flow path 131 and the emission flow path 132, and thus, due to the dead space, a problem is worse where the flowability of a gas is reduced and a processing process performed on a substrate is adversely affected.

On the other hand, in the substrate processing apparatus 1 according to the present inventive concept, the block body 41 is implemented to have all of a connection function, performed on each of the gas supply unit 3 and the substrate processing unit 2, and a selective supply function of selectively supplying a gas. Therefore, comparing with the comparative example, the substrate processing apparatus 1 according to the present inventive concept may decrease a dead space, thereby enhancing the flowability of a gas. Accordingly, the substrate processing apparatus 1 according to the present inventive concept may enhance the quality of a substrate on which a processing process is completed. Also, in the substrate processing apparatus 1 according to the present inventive concept, even when a length of a flow path for connecting the gas supply unit 3 to the substrate processing unit 2 increases, the flow path may be replaced with the block body 41 which is formed to have a length matching the increased length of the flow path, and thus, a measure against a length variation of the flow path for connecting the gas supply unit 3 to the substrate processing unit 2 may be enhanced.

The block body 41 may be coupled to the substrate processing unit 2. For example, the block body 41 may be coupled to the lid 21b. In this case, the block body 41 may be disposed at a position apart from the gas supply unit 3. The block body 41 may be connected to the gas supply unit 3 through a pipe or the like. The block body 41 may be disposed at a position apart from the substrate processing unit 2. In this case, the block body 41 may be connected to the gas injection unit 23 through a pipe or the like.

The block body 41 may include a gas inflow port 411, a gas outflow port 412, and an accommodation unit 413.

The gas inflow port 411 is connected to the gas supply unit 3. The gas inflow port 411 may function as an inflow path through which the gas supplied by the gas supply unit 3 flows in. The gas inflow port 411 may be formed through a drilling process performed on the block body 41.

The gas outflow port 412 is connected to the substrate processing unit 2. The gas outflow port 412 may function as an outflow path through which a gas flowing in through the gas inflow port 411 flows out to the substrate processing unit 2. The gas outflow port 412 may be formed through a drilling process performed on the block body 41. The gas outflow port 412 may be disposed at a bottom surface of the accommodation unit 413. In this case, the gas inflow port 411 may be disposed at a side surface of the accommodation unit 413. The gas outflow port 412 may be disposed at a side surface of the accommodation unit 413. In this case, the gas inflow port 411 may be disposed at a bottom surface of the accommodation unit 413.

The accommodation unit 413 is connected to the each of the gas inflow port 411 and the gas outflow port 412, between the gas inflow port 411 and the gas outflow port 412. The accommodation unit 413 may function as a connection path which connects the gas inflow port 411 to the gas outflow port 412. The accommodation unit 413 may be formed through a drilling process performed on the block body 41.

Referring to FIGS. 2 to 6, the valve unit 42 opens or closes the gas inflow port 411 or the gas outflow port 412. In FIGS. 3 to 8, an embodiment where the valve unit 42 is disposed to open or close the gas outflow port 412 is illustrated, and thus, it is obvious to those skilled in the art to implement an embodiment where the valve unit 42 is disposed to open or close the gas inflow port 411. Hereinafter, an embodiment where the valve unit 42 is disposed to open or close the gas outflow port 412 will be described, but it is obvious to those skilled in the art to implement an embodiment where the valve unit 42 is disposed to open or close the gas inflow port 411.

As illustrated in FIG. 3, in a case where the valve unit 42 opens the gas outflow port 412, the gas supplied by the gas supply unit 3 may be supplied to the substrate processing unit 2 via the gas inflow port 411, the accommodation unit 413, and the gas outflow port 412.

Figure 4:
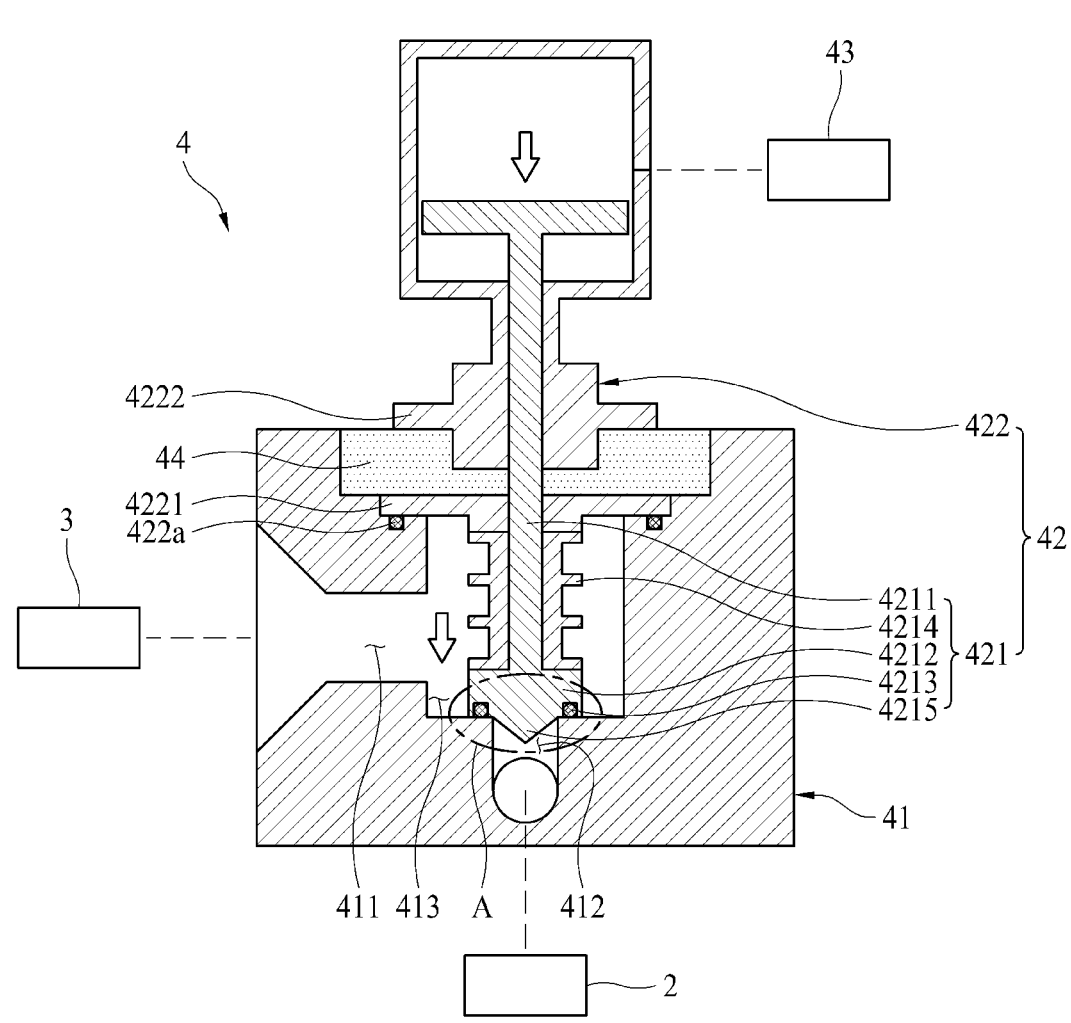
Figure 5:
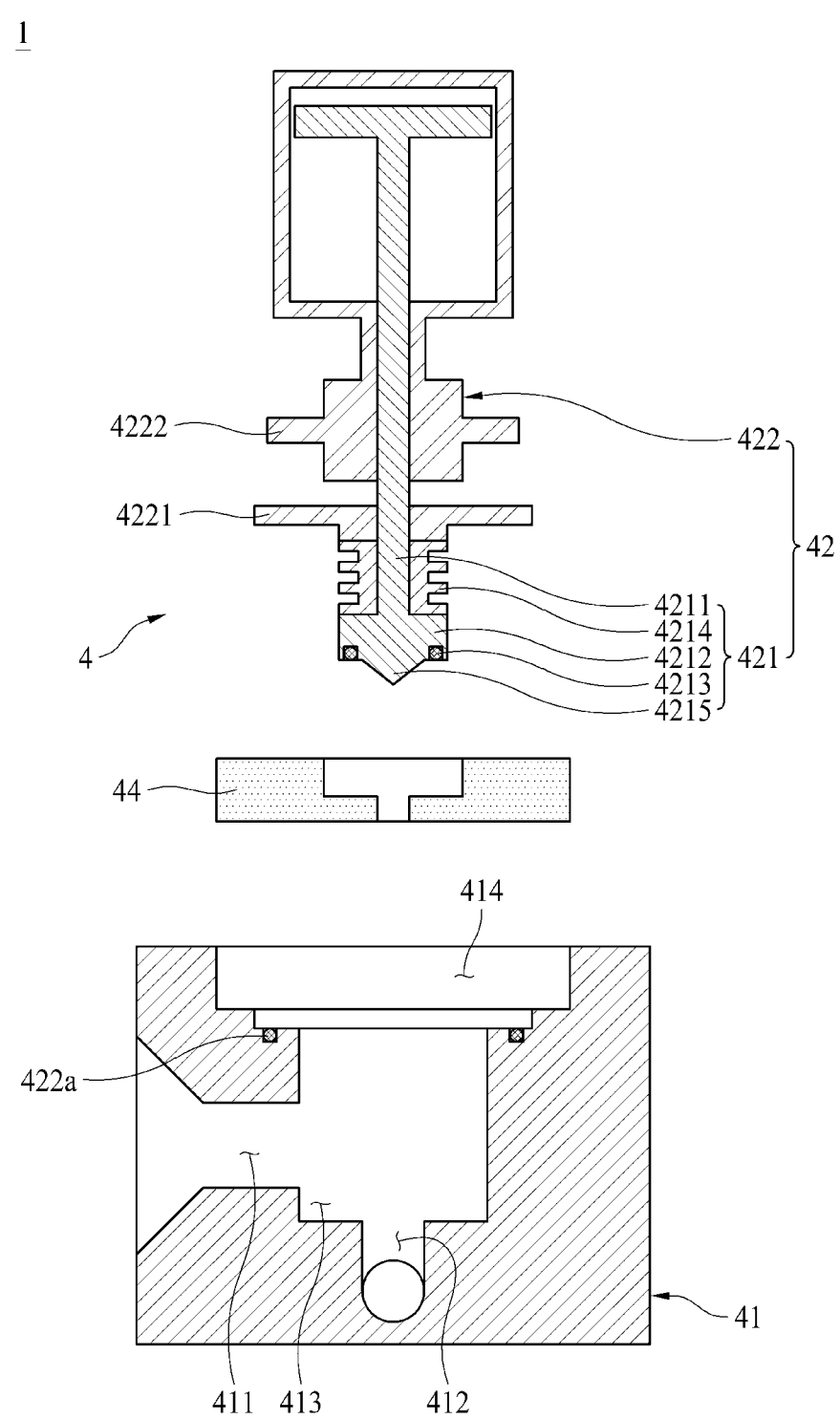
FIG. 5 is a schematic exploded side cross-sectional view of a substrate processing apparatus according to the present inventive concept.
Figure 6:
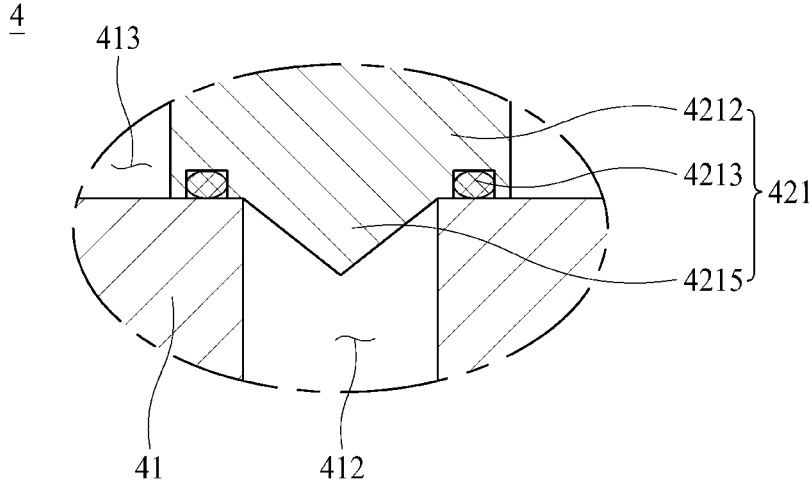
FIG. 6 is a side cross-sectional view illustrating the enlargement of a region A of FIG. 4.

As illustrated in FIG. 4, in a case where the valve unit 42 opens the gas outflow port 412, the gas supplied by the gas supply unit 3 may be prevented from flowing out through the gas outflow port 412. Accordingly, the gas supplied by the gas supply unit 3 may not be supplied to the substrate processing unit 2.

As described above, based on whether the valve unit 42 opens or closes the gas outflow port 412, the gas supplied by the gas supply unit 3 may be selectively supplied to the substrate processing unit 2.

The valve unit 42 may be coupled to the block body 41. In this case, the valve unit 42 may be inserted into the accommodation unit 413. Therefore, the valve unit 42 may open or close the gas outflow port 412 in a state where the valve unit 42 is inserted into the block body 41 through the accommodation unit 413. Accordingly, the substrate processing apparatus 1 according to the present inventive concept may realize the following effects.

First, the substrate processing apparatus 1 according to the present inventive concept is implemented to have all of a connection function, performed on each of the gas supply unit 3 and the substrate processing unit 2 by using the block body 41 and the valve unit 42, and a selective supply function of selectively supplying a gas. Therefore, the substrate processing apparatus 1 according to the present inventive concept may decrease a dead space of a gas flow path for enabling a gas to flow in the block body 41, thereby enhancing the flowability of a gas. Accordingly, the substrate processing apparatus 1 according to the present inventive concept may enhance the quality of a substrate on which a processing process is completed.

Second, in the substrate processing apparatus 1 according to the present inventive concept, because a separate flow path for enabling a gas to flow in the valve unit 42 is not provided, a total size of the valve unit 42 may be reduced. Also, in the substrate processing apparatus 1 according to the present inventive concept, the valve unit 42 may be inserted into the block body 41 through the accommodation unit 413, and thus, a total size of the block valve 4 may be more reduced. Accordingly, in the substrate processing apparatus 1 according to the present inventive concept, the block valve 4 may be implemented to be compact, and thus, an area occupying an installation space may be reduced.

The valve unit 42 may include an opening/closing unit 421 and a valve body 422.

The opening/closing unit 421 is movably coupled to the valve body 422. The opening/closing unit 421 may open or close the gas outflow port 412 while moving in a state where the opening/closing unit 421 is coupled to the valve body 422. The opening/closing unit 421 may contract and expand to open or close the gas outflow port 412. When the valve body 422 is inserted into and coupled to the block body 41, the opening/closing unit 421 may move in the accommodation unit 413 to open or close the gas outflow port 412.

The opening/closing unit 421 may include an opening/closing member 4211, an opening/closing flange 4212, and a blocking member 4213.

The opening/closing member 4211 may be movably coupled to the valve body 422. One side of the opening/closing member 4211 may protrude from the valve body 422, and the other side thereof may be disposed in the valve body 422. One side of the opening/closing member 4211 may be used to open or close the gas outflow port 412. The other side of the opening/closing member 4211 may be used to move for opening or closing the gas outflow port 412. In this case, the driver 43 may move the other side of 7 the opening/closing member 4211, and thus, may move the opening/closing member 4211.

The opening/closing flange 4212 protrudes to an outer portion of the opening/closing member 4211. When the opening/closing unit 421 closes the gas outflow port 412, the opening/closing flange 4212 may contact an inner wall of the block body 41, and thus, may over the gas outflow port 412. Therefore, the gas outflow port 412 may be closed. When the opening/closing unit 421 opens the gas outflow port 412, the opening/closing flange 4212 may be apart from the inner wall of the block body 41. Accordingly, the gas outflow port 412 may be opened. The opening/closing flange 4212 and the opening/closing member 4211 may be provided as one body.

The blocking member 4213 is coupled to the opening/closing flange 4212. When the opening/closing unit 421 closes the gas outflow port 412, the blocking member 4213 may be disposed between the opening/closing flange 4212 and the block body 41, and thus, may block the flow of a gas. Accordingly, the blocking member 4213 may reinforce a closing force corresponding to the gas outflow port 412. The blocking member 4213 may be implemented with an O-ring.

The opening/closing unit 421 may include an elastic member 4214.

The elastic member 4214 may provide an elastic force to the opening/closing member 4211 so that the opening/closing member 4211 moves elastically. The elastic member 4214 may be disposed between the opening/closing flange 4212 and the valve body 422. When the opening/closing member 4211 moves to close the gas outflow port 412, the elastic member 4214 may stretch, and thus, may have a restoring force. In this case, the restoring force of the elastic member 4214 may be used when the opening/closing member 4211 moves to open the gas outflow port 412. The elastic member 4214 may be disposed to surround the opening/closing member 4211. In this case, the opening/closing member 4211 may be disposed in the elastic member 4214. The elastic member 4214 may be implemented as bellows.

The opening/closing unit 421 may include a guide member 4215.

The guide member 4215 protrudes from the opening/closing member 4211. The guide member 4215 may protrude from the opening/closing member 4211 in a direction toward the gas outflow port 412 from the opening/closing member 4211. The guide member 4215 may be formed so that a size thereof is progressively reduced as the guide member 4215 protrudes from the opening/closing member 4211. For example, the guide member 4215 may be implemented so that a diameter thereof is progressively reduced as the guide member 4215 protrudes from the opening/closing member 4211. In a process where the opening/closing unit 421 moves for closing the gas outflow port 412, the guide member 4215 may be inserted into the gas outflow port 412 prior to the opening/closing member 4211. Accordingly, the guide member 4215 may have a function of guiding the opening/closing unit 421 so that the opening/closing unit 421 accurately closes the gas outflow port 412. The guide member 4215 and the opening/closing member 4211 may be provided as one body.

Referring to FIGS. 2 to 6, the valve body 422 is coupled to the block body 41. The opening/closing member 4211 may be movably coupled to the valve body 422. The valve body 422 may be inserted into or coupled to the block body 41 so that the opening/closing member 4211 moves in the accommodation unit 413 to open or close the gas outflow port 412.

The valve body 422 may be inserted into an insertion groove 414 formed in the block body 41. The insertion groove 414 is formed to be connected to the accommodation unit 413. With respect to a direction in which the opening/closing member 4211 moves, the accommodation unit 413 may be disposed between the gas outflow port 412 and the insertion groove 414. The insertion groove 414 may be formed to have a size which is greater than the accommodation unit 413. When all of the insertion groove 414 and the accommodation unit 413 are formed in a circular shape, the insertion groove 414 may be formed to have a diameter which is greater than the accommodation unit 413. Accordingly, a step height may be formed at a portion, at which the accommodation unit 413 is connected to the insertion groove 414, of the block body 41.

The valve body 422 may include a first valve flange 4221.

The first valve flange 4221 may be inserted into the insertion groove 414. The first valve flange 4221 may protrude to an outer portion of the valve body 422. The first valve flange 4221 may be supported by an inner wall of the block body 41 where the insertion groove 414 is formed. A closing member 422a may be disposed between the first valve flange 4221 and the block body 41, in the insertion groove 414. The closing member 422a may close between the first valve flange 4221 and the block body 41, and thus, may prevent a gas from being leaked through a region between the first valve flange 4221 and the block body 41. The closing member 422a may be implemented with a metal gasket. The closing member 422a may be implemented with an O-ring. When the valve body 422 is coupled to the block body 41, the first valve flange 4221 may press the closing member 422a. Accordingly, a closing force using the closing member 422a may be more reinforced.

Referring to FIGS. 2 to 6, the driver 43 drives the valve unit 42. The driver 43 may drive the opening/closing unit 421. Therefore, the opening/closing unit 421 may be moved by the driver 43 to open or close the gas outflow port 412. For example, the driver 43 may drive the valve unit 42 by using a pneumatic pressure. The driver 43 may supply a gas to the valve body 422 or may emit a gas from the valve body 422, and thus, may move a portion of the opening/closing member 4211 disposed in the valve body 422. Therefore, the opening/closing member 4211 may open or close the gas outflow port 412 while moving. The driver 43 may be disposed to be connected to an inner space of the valve body 422. The driver 43 may be connected to the inner space of the valve body 422 through a pipe. The driver 43 may drive the valve unit 42 by using a hydraulic pressure.

Referring to FIGS. 2 to 6, the block valve 4 may include a fixing unit 44.

The fixing unit 44 is inserted into the block body 41. The fixing unit 44 may be inserted into the insertion groove 414 and may press the first valve flange 4221. Therefore, the closing member 422a disposed between the first valve flange 4221 and the block body 41 may forcibly close between the first valve flange 4221 and the block body 41 by using a pressure based on the first valve flange 4221 and a pressure based on the fixing unit 44. Accordingly, the substrate processing apparatus 1 according to the present inventive concept may prevent a gas from being leaked from the gas supply unit 3 to the substrate processing unit 2 by using the closing member 422a. A through hole may be formed in the fixing unit 44. The valve body 422 may be inserted into the through hole.

In a case where the fixing unit 44 is provided, the valve body 422 may include a second valve flange 4222. The second valve flange 4222 may be disposed apart from the first valve flange 4221. The fixing unit 44 may be disposed between the second valve flange 4222 and the first valve flange 4221. Therefore, the second valve flange 4222 may press the fixing unit 44 to press the first valve flange 4221 and may press the first valve flange 4221 to press the closing member 422a. Accordingly, the substrate processing apparatus 1 according to the present inventive concept may press the closing member 422a by using the second valve flange 4222, the fixing unit 44, and the first valve flange 4221, and thus, may more reinforce a blocking force which blocks the leakage of a gas, by increasing a pressure corresponding to the closing member 422a. The second valve flange 4222 may protrude to an outer portion of the valve body 422.

Figure 7:
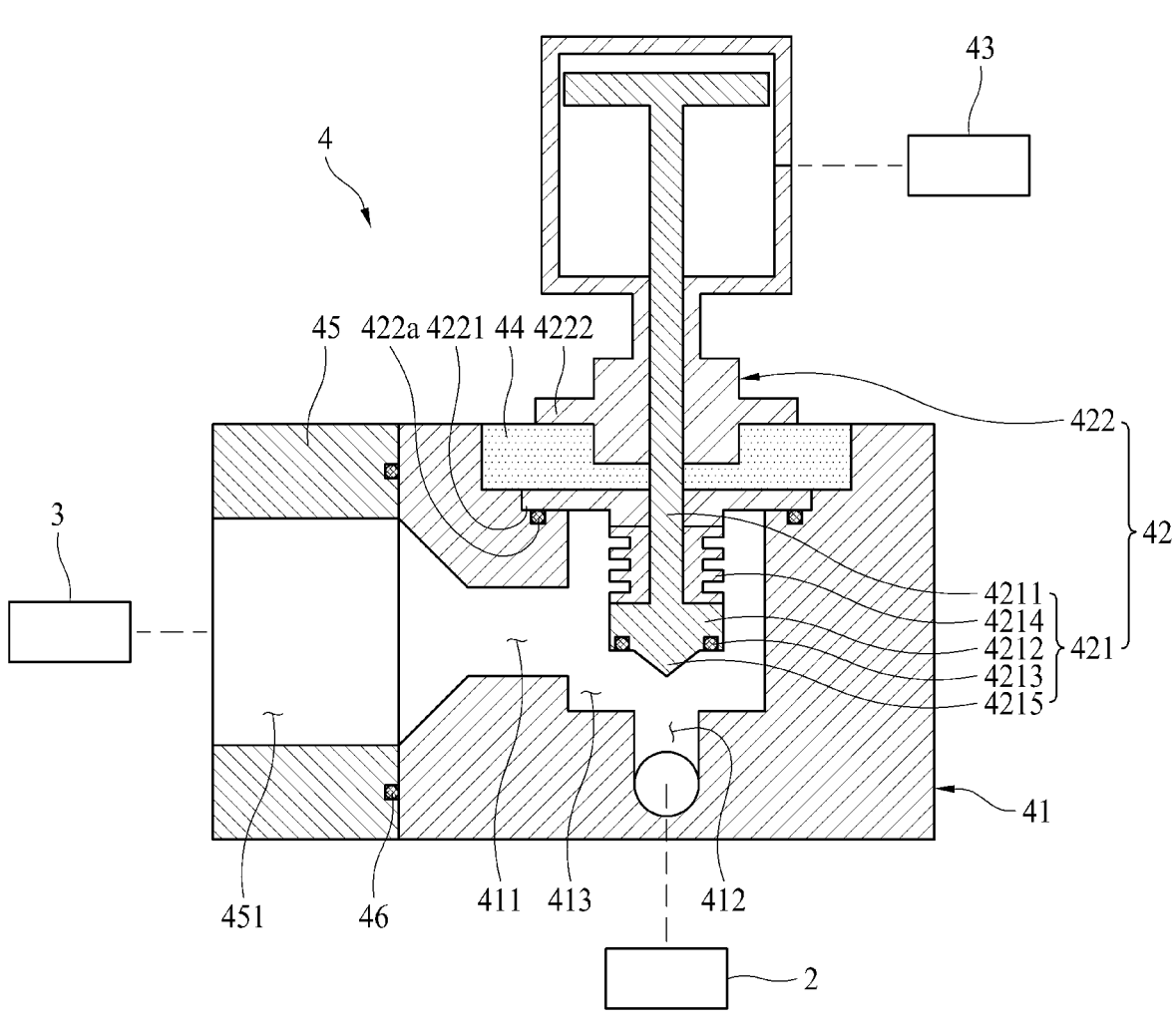
FIG. 7 is a schematic side cross-sectional view illustrating an embodiment where a substrate processing apparatus according to the present inventive concept includes a connection body.

Referring to FIG. 7, the block valve 4 may include a connection body 45 and a sealing member 46.

The connection body 45 is detachably coupled to the block body 41. The connection body 45 may include a connection flow path 451 which is connected to the gas inflow port 411 or the gas outflow port 412. When the connection flow path 451 is connected to the gas inflow port 411 as the connection body 45 is coupled to the block body 41, the connection flow path 451 may function as a flow path through which a gas supplied from the gas supply unit 3 is supplied to the gas inflow port 411. When the connection flow path 451 is connected to the gas outflow port 412 as the connection body 45 is coupled to the block body 41, the connection flow path 451 may function as a flow path through which a gas flowing out from the gas outflow port 412 is supplied to the substrate processing unit 2.

As described above, the substrate processing apparatus 1 according to the present inventive concept is implemented to extend a length of a flow path of a gas through a block by using the connection body 45. Accordingly, the substrate processing apparatus 1 according to the present inventive concept may enhance the easiness of an operation of extending a length of a flow path of a gas depending on the case. The connection body 45 may be detachably coupled to the block body 41 by using a fastening means such as a bolt.

The sealing member 46 may be disposed between the connection body 45 and the block body 41. The sealing member 46 may prevent a gas, flowing along the connection flow path 451, from being leaked through between the connection body 45 and the block body 41. The sealing member 46 may be implemented with an O-ring.

Figure 8:
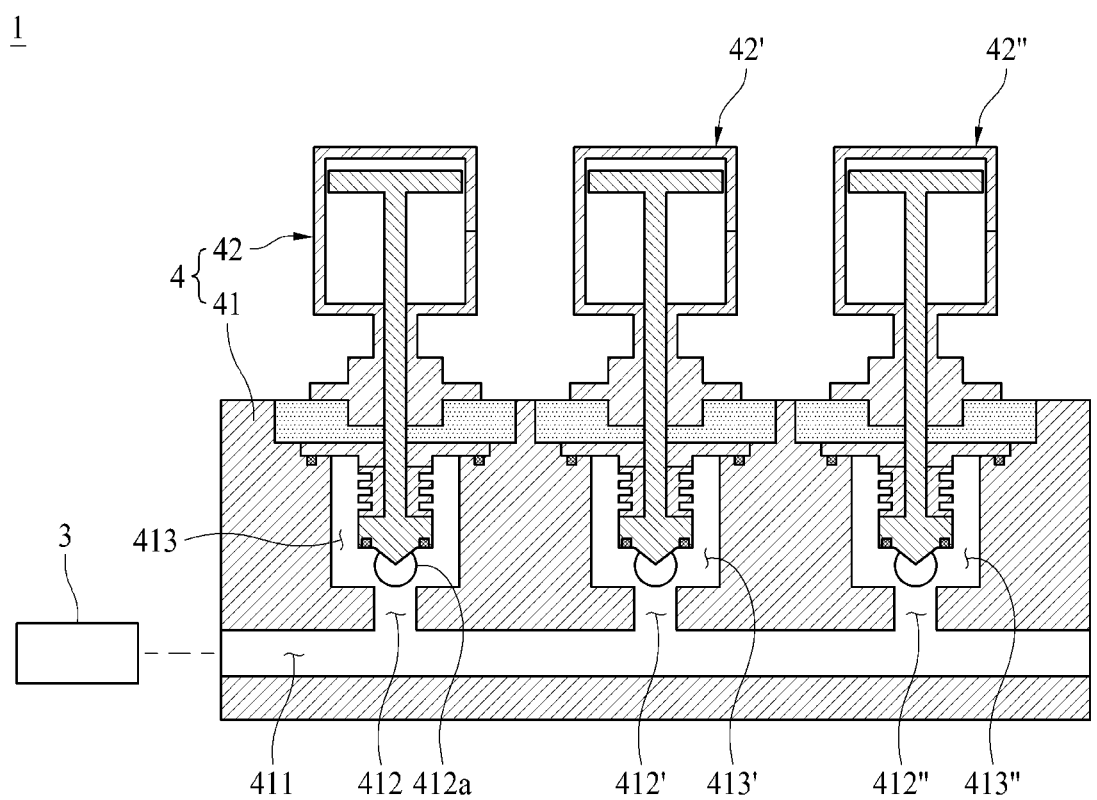
FIG. 8 is a schematic side cross-sectional view illustrating an embodiment where a block body includes a plurality of gas emission ports in a substrate processing apparatus according to the present inventive concept.

Referring to FIG. 8, the block body 41 may include a plurality of gas outflow ports 412. In this case, the gas inflow port 411 may be formed in the block body 41 so as to be connected to each of the gas outflow ports 412. The block valve 4 may include a plurality of valve units 42. Each of the valve units 42 may be coupled to the block body 41 to individually open or close the gas outflow port 412. Therefore, a gas flowing along the gas inflow port 411 may be supplied to the substrate processing unit 2 through regions, opened by the valve units 42, of the gas outflow port 412. As described above, the substrate processing apparatus 1 according to the present inventive concept may be implemented as a manifold type where a gas selectively flows out through the plurality of gas outflow ports 412 by using one block body 41. An outflow portion, at which the gas outflow ports 412 are connected to the substrate processing unit 2, may be disposed in the accommodation unit 413. Accordingly, when the valve units 42 open the gas outflow port 412, the gas supplied by the gas supply unit 3 may be supplied to the accommodation unit 413 via the gas inflow port 411 and the gas outflow port 412, and then, may be supplied to the substrate processing unit 2 through the outflow portion 412a of the gas outflow port 412.

In FIG. 8, it is illustrated that three gas outflow ports 412, 412', and 412" are formed in the block body 41 and three valve units 42, 42', and 42" are coupled thereto, but the present inventive concept is not limited thereto and two or four or more gas outflow ports 412 may be formed in the block body 41 and the two or four or more valve units 42, 42', and 42" may be coupled thereto. In this case, the number of gas outflow ports 412 and the number of valve units 42 may be identically implemented.

The block body 41 may include a plurality of accommodation units 413. In this case, the accommodation units 413 may be respectively connected to the gas outflow ports 412. An outflow portion, at which the gas outflow ports 412 are connected to the substrate processing unit 2, may be respectively disposed in each of the accommodation units 413. The block valve 4 may include a plurality of valve units 42. The valve units 42 may be coupled to the block body 41 so as to be inserted into each of the accommodation units 413.

In FIG. 8, it is illustrated that three accommodation units 413, 413', and 413" are formed in the block body 41 and three valve units 42, 42', and 42" are coupled thereto, but the present inventive concept is not limited thereto and two or four or more accommodation units 413 may be formed in the block body 41 and two or four or more valve units 42 may be coupled thereto. In this case, the number of accommodation units 413 and the number of valve units 42 may be identically implemented.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. A block valve for substrate processing apparatuses for selectively supplying a gas, supplied by a gas supply unit, to a substrate processing unit where a processing process is performed on a substrate, the block valve comprising: a block body connected to each of the gas supply unit and the substrate processing unit; a valve unit coupled to the block body; and a driver driving the valve unit, wherein the block body comprises a gas inflow port connected to the gas supply unit, a gas outflow port connected to the substrate processing unit, and an accommodation unit connected to each of the gas inflow port and the gas outflow port, between the gas inflow port and the gas outflow port, the valve unit comprises an opening/closing unit opening or closing one of the gas inflow port and the gas outflow port, and a valve body movably coupled to the opening/closing unit, and the valve body is inserted into the block body so that the opening/closing unit moves in the accommodation unit to open or close one of the gas inflow port and the gas outflow port, and the opening/closing unit comprises an opening/closing member movably coupled to the valve body; an opening/closing flange protruding to an outer portion of the opening/closing member, wherein the opening/closing flange and the opening/closing member are unitary, and may cover the gas outflow port; and a guide member protruding from the opening/closing member toward the gas inflow port or the gas outflow port, wherein the guide member and the opening/closing member are unitary, the block body comprises an insertion groove formed to be connected to the accommodation unit, the insertion groove having a diameter greater than that of the accommodation unit and having a step formed at a portion connected to the accommodation unit, and a first valve flange is inserted into the insertion groove and supported by an inner wall of the block body where the insertion groove is formed, and the valve body comprises a second valve flange disposed apart from the first valve flange, and a closing member is disposed between the first valve flange and the block body in the insertion groove; and a fixing unit having a through hole into which the valve body is inserted is disposed between the first valve flange and the second valve flange in the insertion groove, and the second valve flange presses the fixing unit to press the first valve flange, and the first valve flange presses the closing member.

2. The block valve of claim 1, wherein
the opening/closing unit comprises an opening/closing member movably coupled to the valve body, an opening/closing flange protruding to an outer portion of the opening/closing member, and a blocking member coupled to the opening/closing flange, and
when the opening/closing unit closes the gas inflow port or the gas outflow port, the blocking member is disposed between the opening/closing flange and the block body to block the flow of the gas.

3. The block valve of claim 1, wherein
the opening/closing unit comprises an opening/closing member movably coupled to the valve body, and an elastic member providing an elastic force to the opening/closing member so that the opening/closing member moves elastically, and
the elastic member is disposed between a first valve flange of the valve body and an opening/closing flange of the opening/closing member.

4. The block valve of claim 1, wherein
the opening/closing unit comprises an opening/closing member movably coupled to the valve body, and a guide member protruding from the opening/closing member in a direction from the opening/closing member to the gas inflow port or the gas outflow port, and
the guide member is formed so that a size thereof is progressively reduced as the guide member protrudes from the opening/closing member, and in a process where the opening/closing unit moves for closing the gas inflow port or the gas outflow port, the guide member is inserted into the gas inflow port or the gas outflow port prior to the opening/closing member.

5. The block valve of claim 1, further comprising a connection body detachably coupled to the block body, and a sealing member disposed between the connection body and the block body, wherein the connection body comprises a connection flow path connected to the gas inflow port or the gas outflow port.

6. The block valve of claim 1, wherein the block body comprises a plurality of gas outflow ports, and a plurality of valve units are coupled to the block body to individually open or close each of the gas outflow ports.

7. The block valve of claim 1, wherein the block body comprises a plurality of accommodation units, and a plurality of valve units are coupled to the block body so as to be respectively inserted into the accommodation units.

8. A substrate processing apparatus comprising: a chamber providing a processing space; a supporting unit supporting at least one substrate; a gas injection unit injecting a gas toward the supporting unit; a gas supply unit supplying the gas to the gas injection unit; and a block valve connected to each of the gas supply unit and the gas injection unit, wherein the block valve comprises: a block body connected to each of the gas supply unit and the gas injection unit; a valve unit coupled to the block body; and a driver driving the valve unit, the block body comprises a gas inflow port connected to the gas supply unit, a gas outflow port connected to the gas injection unit, and an accommodation unit connected to each of the gas inflow port and the gas outflow port between the gas inflow port and the gas outflow port, the valve unit comprises an opening/closing unit opening or closing one of the gas inflow port and the gas outflow port, and a valve body movably coupled to the opening/closing unit, and the valve body is inserted into the block body so that the opening/closing unit moves in the accommodation unit to open or close one of the gas inflow port and the gas outflow port, and the opening/closing unit comprises an opening/closing member movably coupled to the valve body; an opening/closing flange protruding to an outer portion of the opening/closing member, wherein the opening/closing flange and the opening/closing member are unitary, and may cover the gas outflow port; and a guide member protruding from the opening/closing member toward the gas inflow port or the gas outflow port, wherein the guide member and the opening/closing member are unitary, and the block body comprises an insertion groove formed to be connected to the accommodation unit, the insertion groove having a diameter greater than that of the accommodation unit and having a step formed at a portion connected to the accommodation unit, and a first valve flange is inserted into the insertion groove and supported by an inner wall of the block body where the insertion groove is formed, and the valve body comprises a second valve flange disposed apart from the first valve flange, and a closing member is disposed between the first valve flange and the block body in the insertion groove; and a fixing unit having a through hole into which the valve body is inserted is disposed between the first valve flange and the second valve flange in the insertion groove, and the second valve flange presses the fixing unit to press the first valve flange, and the first valve flange presses the closing member.

\* \* \* \* \*